United States Patent [19]

Toyoshima et al.

[11] Patent Number: 5,093,629
[45] Date of Patent: Mar. 3, 1992

[54] AMPLIFIER CIRCUIT HAVING SECOND ORDER SIGNAL CANCELLATION

[75] Inventors: Gen Toyoshima; Yukio Ikeda; Noriharu Suematsu; Yoji Isota; Tadashi Takagi; Shuji Urasaki, all of Kanagawa, Japan

[73] Assignee: Mitsubishi Denki Kabushiki Kaisha, Japan

[21] Appl. No.: 631,845

[22] Filed: Dec. 21, 1990

[30] Foreign Application Priority Data

Dec. 27, 1989 [JP] Japan ................. 1-341054

[51] Int. Cl.[5] ............................................. H03F 1/26
[52] U.S. Cl. .................................. 330/149; 330/151; 330/277; 328/163
[58] Field of Search ................. 330/149, 151, 277; 328/163

[56] References Cited

U.S. PATENT DOCUMENTS 3,732,502 5/1973 Seidel ..................... 330/151 X
3,825,843 7/1974 Felsberg et al. ............ 328/163

FOREIGN PATENT DOCUMENTS 243898 4/1987 European Pat. Off. .

Primary Examiner—James B. Mullins
Attorney, Agent, or Firm—Rothwell, Figg, Ernst & Kurz

[57] ABSTRACT

An amplifier circuit suitable for use in various types of communication devices, radar systems and the like, wherein a fundamental-wave signal extracted from an input side is converted into a second order signal and the second order signal is shifted so as to be opposite in phase and equal in amplitude to a second order signal produced by an amplifier such as an FET or multistage operational amplifier. The phase shifted signal is applied to the amplifier output, whereby the second order signal produced by the amplifier can assuredly be equivalently short-circuited and the operation efficiency of the amplifier can be improved.

11 Claims, 4 Drawing Sheets

AMPLIFIER CIRCUIT HAVING SECOND ORDER SIGNAL CANCELLATION

BACKGROUND OF THE INVENTION

1. Field of the Invention

The present invention relates to a semiconductor amplifier, and particularly to an improvement in the efficiency of a semiconductor amplifier suitable for use in a satellite communication system, a ground microwave communication system, a radar system and the like, and which is operable in a microwave or semimicrowave frequency band.

2. Description of the Prior Art

FIG. 1 is a circuit diagram showing a conventional semiconductor amplifier which is disclosed in, for example, "SEMICONDUCTOR CIRCUIT FOR HIGH-FREQUENCY POWER", Japanese Patent Laid-Open No. 159002/1983. Referring to FIG. 1, there are shown an input terminal 1, an output terminal 2, an FET (Field Effect Transistor) 3, a gate terminal 4, a drain terminal 5, a source terminal 6, a gate bias terminal 11, a drain bias terminal 12, a gate bias choke line 13 used to apply a bias to gate 4, a drain bias choke line 14 used to apply a bias to drain 5, an input-side d.c. blocking capacitor 16, an input-side impedance matching line 17, an output-side impedance matching line 18, an input-side impedance matching capacitor 19, an output-side impedance matching capacitor 20, a second harmonic or second order signal short-circuiting line 21 and a capacitor 22.

The second harmonic signal short-circuiting line 21 has a length corresponding to about ¼ wavelength of a fundamental wave. Line 21 is a strip line or distributed constant line that is conventionally used in microwave band circuits.

A description will now be made of the operation of the conventional semiconductor amplifier.

The conventional semiconductor amplifier is operated at a high efficiency because the second harmonic signal (i.e., a signal having twice the frequency of the input signal) is canceled or short-circuited at the drain terminal 5 by means of the short-circuiting strip line 21 and the capacitor 22. Since the gain of the FET transistor 3 must be set at the design stage to be precisely controlled, the amplitude of the second harmonic signal is determined by the amplitude of the fundamental signal. Although the FET produces multiple harmonics of the input signal, harmonics above the second have a very small amplitude and can thus be neglected.

As described above, the conventional semiconductor amplifier serves to short-circuit the second order signal by making use of the second order signal short-circuiting strip line 21 and the capacitor 22 as a passive circuit. However, the semiconductor amplifier is accompanied by the problem in that the second harmonic signal cannot be short-circuited without failure in a microwave band because the second harmonic signal short-circuiting strip line 21 and the capacitor 22 are subject to great losses within this band.

SUMMARY OF THE INVENTION

In view of the foregoing, it is an object of the present invention to provide a semiconductor amplifier which can accomplish equivalent short-circuiting of a second order signal without failure, under operation in a microwave band.

According to one aspect of this invention, there is provided an amplifier circuit comprising:

means for extracting part of a fundamental-wave signal inputted to an amplifier such as a semiconductor transistor;

means for generating a second harmonic signal of twice the fundamental-wave frequency extracted by said signal extracting means; and means for shifting the phase of the second harmonic signal so as to be opposite in phase and equal in amplitude to a second order signal produced by the semiconductor amplifier and which is applied to the output of the semiconductor amplifier;

whereby both second order signals cancel each other out to equivalently short-circuit the same.

The above and other objects, features and advantages of the present invention will become more apparent from the following description and the appended claims, taken in conjunction with the accompanying drawings in which preferred embodiment of the present invention are shown by way of illustrative example.

DETAILED DESCRIPTION OF THE PREFERRED EMBODIMENTS

Preferred embodiments of this invention will now be described in detail referring to the accompanying drawings.

Figure 1:
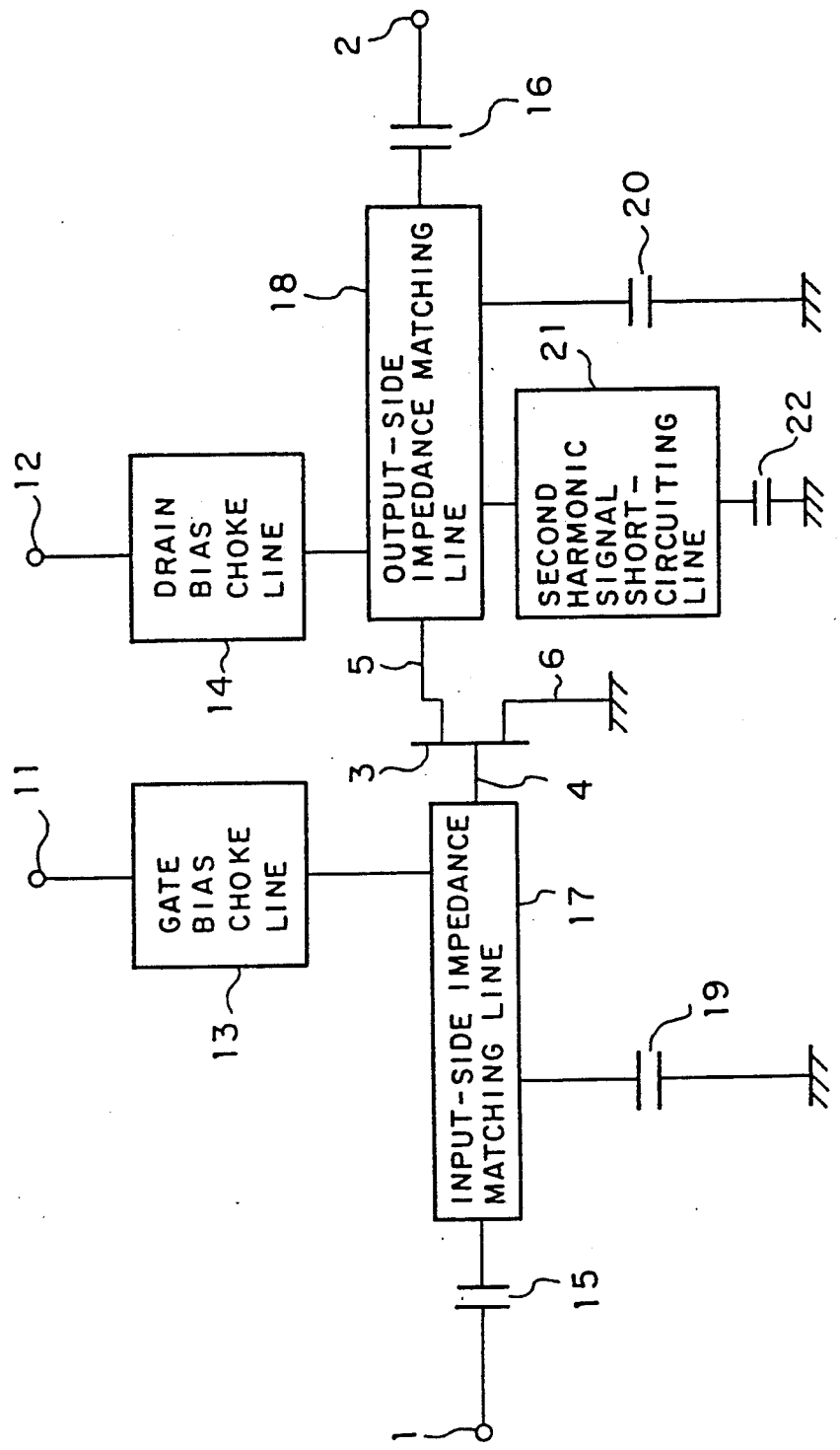
FIG. 1 is a circuit diagram showing a conventional semiconductor amplifier.
Figure 2:
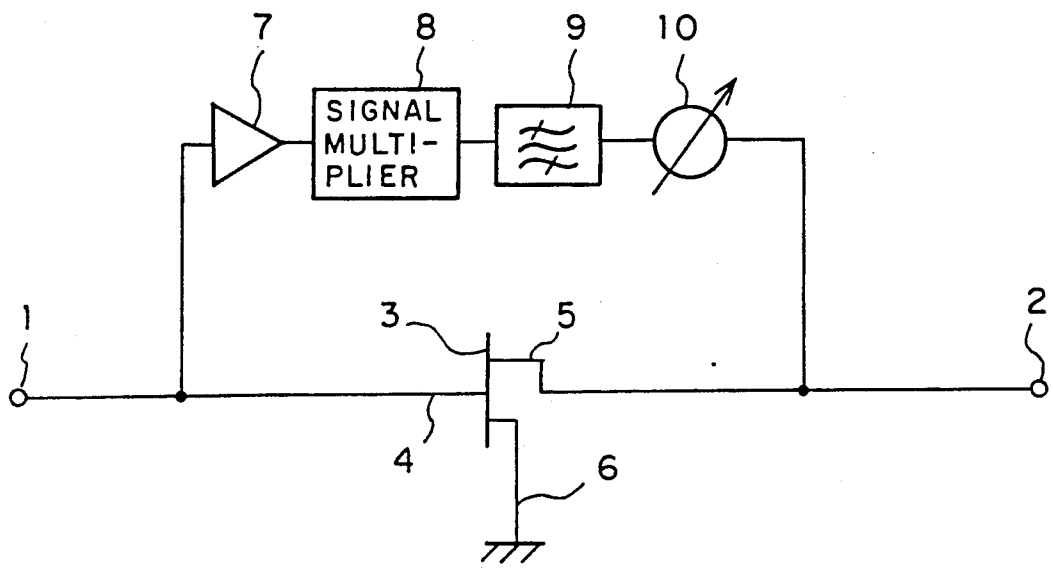
FIG. 2 is a circuit diagram showing a semiconductor amplifier according to a first embodiment of this invention.

FIG. 2 shows a first embodiment. There are shown an input terminal 1, an output terminal 2, an FET 3, a gate terminal 4, a drain terminal 5 and a source terminal 6. There are also shown an amplifier 7, a signal multiplier 8 as a second order signal generating means for generating a signal of double or twice the frequency of a fundamental wave (hereinafter called "fundamental-wave signal"), a band-pass filter 9 for eliminating spurious waves other than the second order wave and a phase shifter 10 as a signal phase shifting means. The amplifier 7, the multiplier 8, the band-pass filter 9 and the phase shifter 10 are arranged in cascade connection between the input terminal 1 and the output terminal 2.

A description will now be made of operation of an amplifier circuit constructed as described above. A part of the fundamental-wave signal inputted to the input terminal 1 is applied to the amplifier 7. The fundamental-wave signal is amplified by the amplifier 7 and is converted into a signal of twice the frequency of the fundamental-wave signal, i.e., a second order or second harmonic signal, by the multiplier 8. The second order signal produced by the multiplier 8 is adjusted so as to be opposite in phase to a second order signal produced at the drain terminal 5 of the FET 3 by the phase shifter 10, and is supplied to the drain terminal 5. The amplitude of the second order signal is controlled by adjusting the gain of amplifier 7. The second order signal produced at the drain terminal 5 is canceled out by the second order signal from phase shifter 10 having the opposite phase and the same amplitude as described above so that it is equivalently short-circuited, thus making it possible to operate this amplifier at a high efficiency. Band pass filter 9 effectively eliminates all higher and lower order signals which may be generated by amplifier 7 and signal multiplier 8 from being propagated to drain terminal 5. Additionally, phase shifter 10 shifts the phase of the second order by an amount necessary to render it opposite in phase to the second order signal produced at drain terminal 5. Because of the phase altering characteristics of the circuit transmission path, phase shifter 10 will not necessarily shift the phase by 180°.

Figure 3:
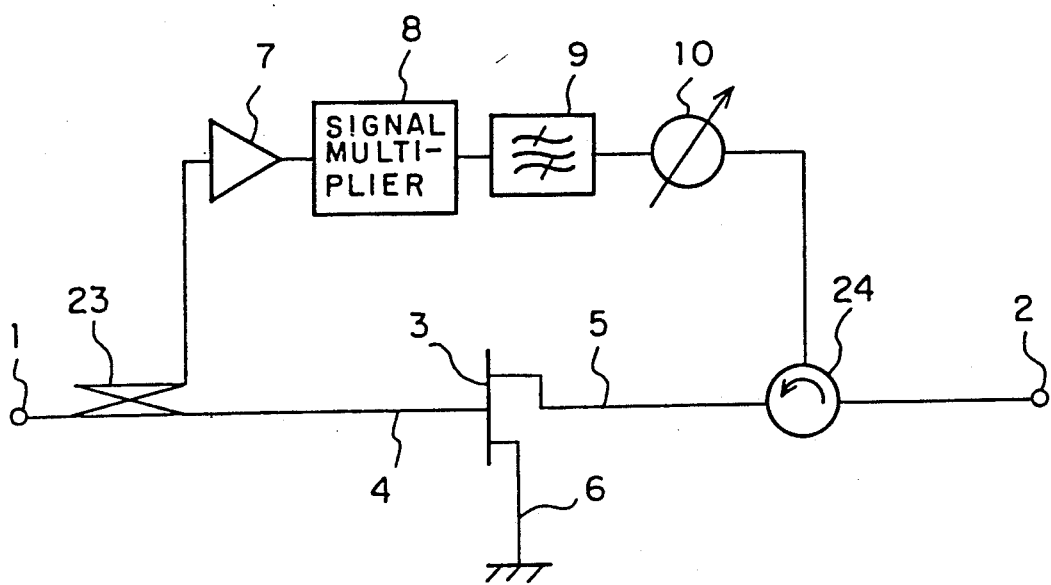
FIG. 3 is a circuit diagram showing a semiconductor amplifier according to a second embodiment of this invention.

FIG. 3 is a circuit diagram showing a semi-conductor amplifier circuit according to a second embodiment of this invention. Referring to FIG. 3, numeral 23 is a directional coupler and numeral 24 is a circulator. The directional coupler 23 is used as a signal extracting means for extracting part of the inputted fundamental-wave signal at terminal 1. The circulator 24 is used for applying the second-order signal produced by the multiplier 8 to the drain terminal 5.

Figure 4:
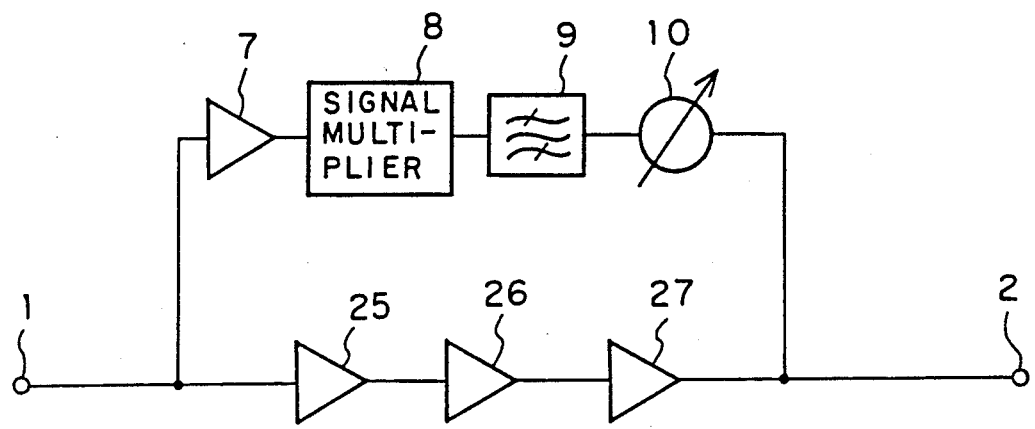
FIG. 4 is a circuit diagram showing a semiconductor amplifier according to a third embodiment of this invention.

FIG. 4 is a circuit diagram showing an amplifier circuit according to a third embodiment of this invention, in which a multistage amplifier such as a 3-stage type amplifier is used. Referring to FIG. 4, there are shown a first-stage amplifier 25, a second-stage amplifier 26 and a third-stage amplifier 27.

This amplifier circuit is constructed in the following manner. Namely, part of a fundamental-wave signal to be inputted to the first-stage amplifier 25 is extracted, and a second order signal is produced in accordance with the circuit defined by an amplifier 7, a signal multiplier 8, a band-pass filter 9 and a phase shifter 10, and this signal is applied to a drain terminal of the third-stage amplifier 27. As long as the part of the fundamental-wave signal inputted to the first-stage amplifier 25 is extracted and the produced second order signal is applied to the drain terminal of the last stage amplifier, the number of stages of amplifiers is not necessarily limited to three stages. Therefore, any number of stages may be utilized.

Figure 5:
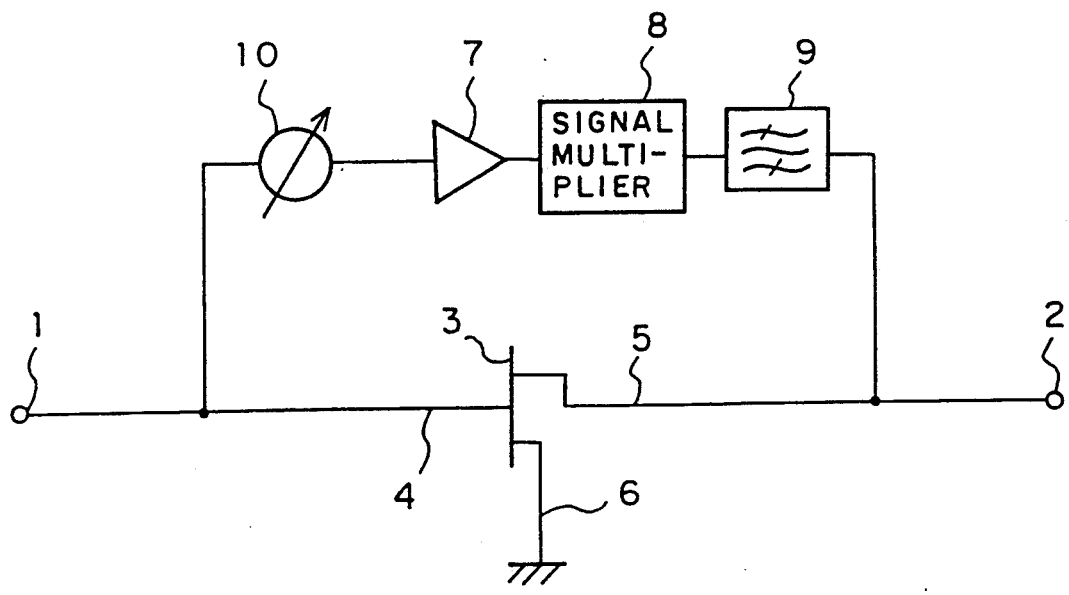
FIG. 5 is a circuit diagram showing a semiconductor amplifier according to a fourth embodiment of this invention.

FIG. 5 is a circuit diagram illustrating a semiconductor amplifier circuit according to a fourth embodiment of this invention. As shown in FIG. 5, a phase shifter 10, an amplifier 7, a signal multiplier 8 and a band-pass filter 9 may be arranged in that order. In other words, the proper functioning of the circuit is independent of the order in which the cancelling second order signal producing components are arranged.

Figure 6:
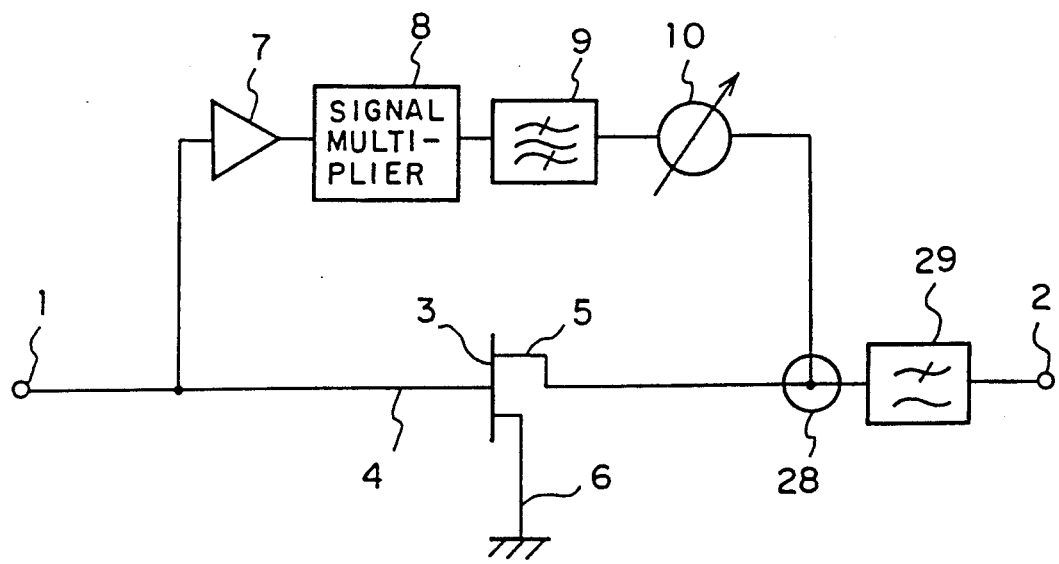
FIG. 6 is a circuit diagram showing a semiconductor amplifier according to a fifth embodiment of this invention.

FIG. 6 is a circuit diagram showing a semiconductor amplifier circuit according to a fifth embodiment of this invention. Referring to FIG. 6, there are shown a T-type branch box 28 as an output applying means and a low-pass filter 29 provided on an output side of the T-type branch box 28. The low-pass filter 29 has a characteristic for passing a fundamental-wave signal and cutting off a second order signal.

Since the second order signal produced by the multiplier 8 is propagated along two directions, i.e., towards the drain terminal 5 and towards the output terminal 2 in each of the first to fourth embodiments shown in FIGS. 2 through 5, the signal is subject to amplitude losses and thus it is necessary to increase the gain of each of the multiplier 8 and the amplifier 7 in order to equivalently short-circuit the drain terminal of the amplifier with respect to the second order signal. However, since the second order signal which would be distributed on the side of the output terminal is cut off by the low-pass filter 29 in the fifth embodiment shown in FIG. 6, the fifth embodiment can bring about advantageous effects in that the fundamental-wave signal only can be extracted at output terminal 2 and the increase in the gain of each of the multiplier 8 and the amplifier 7 becomes unnecessary.

Figure 7:
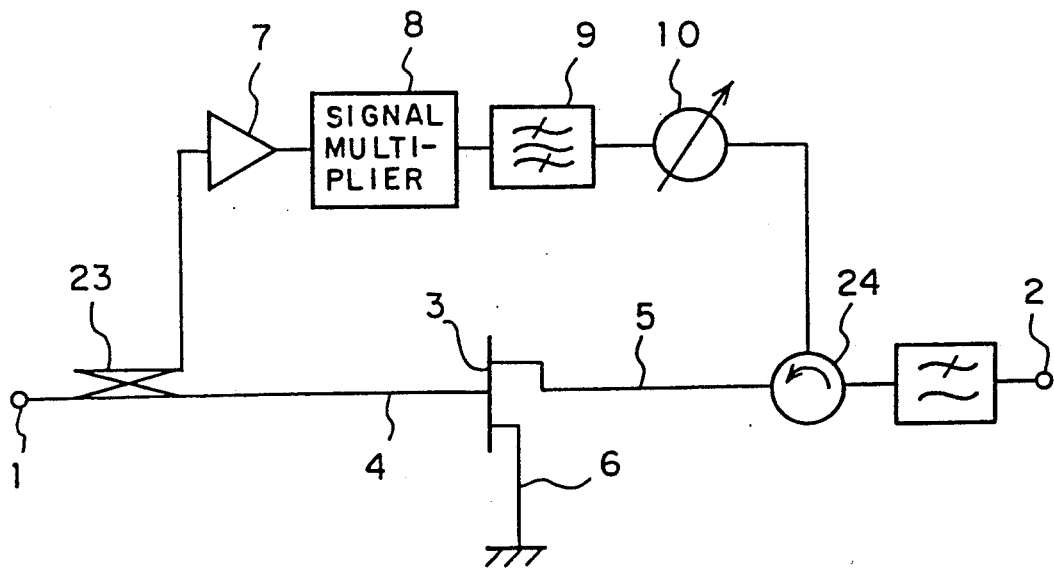
FIG. 7 is a circuit diagram showing a semiconductor amplifier according to a sixth embodiment of this invention.

FIG. 7 is a circuit diagram showing a semiconductor amplifier circuit according to a sixth embodiment of this invention. A directional coupler 23 is used for extracting part of an inputted fundamental wave signal, whereas a circulator 24 is employed for applying a second order signal produced by signal multiplier 8 to the drain terminal of FET 3. In addition, a low-pass filter 29 is used for preventing the second order signal from being propagated to the output terminal 2.

Incidentally, since the low-pass filter 29 has a function for passing the fundamental-wave signal and cutting off the second order signal, it may be equivalently replaced with a band-pass filter or band-rejection filter to accomplish the same result.

Similarly, since the band-pass filter 9 has a function for passing the second order signal and cutting off the fundamental-wave signal, it may be equivalently replaced with a high-pass filter or band-rejection filter to accomplish the same result.

According to this invention, as has been described above, a part of the fundamental-wave signal inputted to the semiconductor amplifier is extracted and thereafter the extracted signal is converted into a second order signal by the second order signal generating components 7, 8, 9 and 10. Further, the second order signal thus converted is adjusted so as to be opposite in phase to the second order signal inherently produced by the semiconductor amplifier by using a phase shifter. Then, this second order signal of opposite phase is applied to the output side of the semiconductor amplifier so as to cancel the second order signal produced by the semiconductor amplifier. It is therefore possible to equivalently short-circuit such a second order signal without failure and improve the operation efficiency as compared with the second order signal processing effected by the conventional passive circuit.

Having now fully described the invention, it will be apparent to those skilled in the art that many changes and modifications can be made without departing from the spirit or scope of the invention as set forth herein.

What is claimed is:

1. An amplifier circuit, comprising:
    amplifier means for amplifying an input signal having a certain fundamental frequency and providing said amplified input signal at an output terminal; and
    cancelling means for cancelling out a second order harmonic signal generated by a predetermined gain of said amplifier means, including
        means for generating a second order signal of twice said fundamental frequency, means for shifting a phase of said second order signal to be opposite to a phase of said amplified input signal, means for adjusting the amplitude of said second order signal to be equal to the amplitude of said amplified input signal, and means for applying the phase-shifted, amplitude adjusted second order signal to said output terminal so as to cancel out a second order signal generated by said amplifier means.

2. An amplifier circuit according to claim 1, wherein said second order signal generating means comprises a signal multiplier.

3. An amplifier circuit according to claim 2, wherein said phase shifting means comprises a phase shifter.

4. An amplifier circuit according to claim 3, wherein said amplifier means comprises a multistage amplifier.

5. An amplifier circuit according to claim 3, wherein said amplifier means comprises an FET.

6. An amplifier circuit according to claim 5, wherein said means for applying comprises a circulator.

7. An amplifier circuit according to claim 5, wherein said means for applying comprises a T-type branch box.

8. An amplifier circuit according to claim 5, wherein said amplitude adjusting means comprises an amplifier.

9. An amplifier circuit according to claim 1, further comprising a directional coupler for coupling part of said input signal to said cancelling means.

10. An amplifier circuit according to claim 1, wherein said cancelling means further comprises a filter for blocking signals of frequencies other than said second order from being applied to said output terminal.

11. An amplifier circuit according to claim 1, further comprising a filter coupled to said output terminal for cutting off said second order signal generated by said cancelling means.

* * * * *